(12) United States Patent
Hahn et al.

(10) Patent No.: US 8,017,953 B2
(45) Date of Patent: Sep. 13, 2011

(54) LUMINESCENCE DIODE CHIP WITH CURRENT SPREADING LAYER AND METHOD FOR PRODUCING THE SAME

(75) Inventors: Berthold Hahn, Hemau (DE); Ralph Wirth, Pettendorf-Adlersberg (DE); Tony Albrecht, Bad Abbach (DE); Magnus Ahlstedt, Regensburg (SE); Stefan Illek, Deonaustauf (DE); Klaus Streubel, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 219 days.

(21) Appl. No.: 12/158,474

(22) PCT Filed: Nov. 21, 2006

(86) PCT No.: PCT/DE2006/002046
§ 371 (c)(1),
(2), (4) Date: Oct. 15, 2008

(87) PCT Pub. No.: WO2007/076743
PCT Pub. Date: Jul. 12, 2007

(65) Prior Publication Data
US 2009/0127580 A1    May 21, 2009

(30) Foreign Application Priority Data

Dec. 23, 2005 (DE) .......................... 10 2005 061 797

(51) Int. Cl.
*H01L 27/15* (2006.01)

(52) U.S. Cl. ................ 257/79; 257/94; 257/98; 257/99; 257/E33.016

(58) Field of Classification Search ................ 257/14, 257/85, 79, 94, 96–99, 103, E33.016
See application file for complete search history.

(56) References Cited

U.S. PATENT DOCUMENTS

| 5,717,226 A | 2/1998 | Lee et al. |
| 5,789,768 A | 8/1998 | Lee et al. |
| 5,869,849 A * | 2/1999 | Jou et al. .......................... 257/96 |

(Continued)

FOREIGN PATENT DOCUMENTS

DE    10 2005 003 460    10/2001

(Continued)

OTHER PUBLICATIONS

Notification of Transmittal of Translation of the International Preliminary Report on Patentability issued on Sep. 18, 2008 for corresponding International Application No. PCT/DE2006/002046.

(Continued)

*Primary Examiner* — Evan Pert
*Assistant Examiner* — Scott Wilson
(74) *Attorney, Agent, or Firm* — Fish & Richardson P.C.

(57) ABSTRACT

An LED chip is specified that comprises at least one current barrier. The current barrier is suitable for selectively preventing or reducing, by means of a reduced current density, the generation of radiation in a region laterally covered by the electrical connector body. The current spreading layer contains at least one TCO (Transparent Conductive Oxide). In a particularly preferred embodiment, at least one current barrier is contained which comprises material of the epitaxial semiconductor layer sequence, material of the current spreading layer and/or an interface between the semiconductor layer sequence and the current spreading layer. A method for producing an LED chip is also specified.

20 Claims, 11 Drawing Sheets

U.S. PATENT DOCUMENTS

| | | | |
|---|---|---|---|
| 6,420,732 B1 * | 7/2002 | Kung et al. | 257/79 |
| 6,459,098 B1 | 10/2002 | Chen et al. | |
| 6,492,661 B1 | 12/2002 | Chien et al. | |
| 6,580,096 B2 | 6/2003 | Chen et al. | |
| 2001/0011730 A1 | 8/2001 | Saeki | |
| 2002/0020842 A1 | 2/2002 | Sasaki et al. | |
| 2003/0222269 A1 | 12/2003 | Lin et al. | |
| 2005/0236632 A1 | 10/2005 | Lai et al. | |
| 2006/0222040 A1 | 10/2006 | Schmid et al. | |
| 2007/0278508 A1 | 12/2007 | Baur et al. | |
| 2009/0008751 A1 | 1/2009 | Illek et al. | 257/632 |

FOREIGN PATENT DOCUMENTS

| | | |
|---|---|---|
| DE | 101 19 507 | 3/2002 |
| DE | 10 2004 026 231 | 12/2005 |
| DE | 10 2004 057 802 | 6/2006 |
| TW | 541716 | 7/2003 |

OTHER PUBLICATIONS

International Search Report for PCT/DE2006/002046by dated Mar. 30, 2007.

* cited by examiner

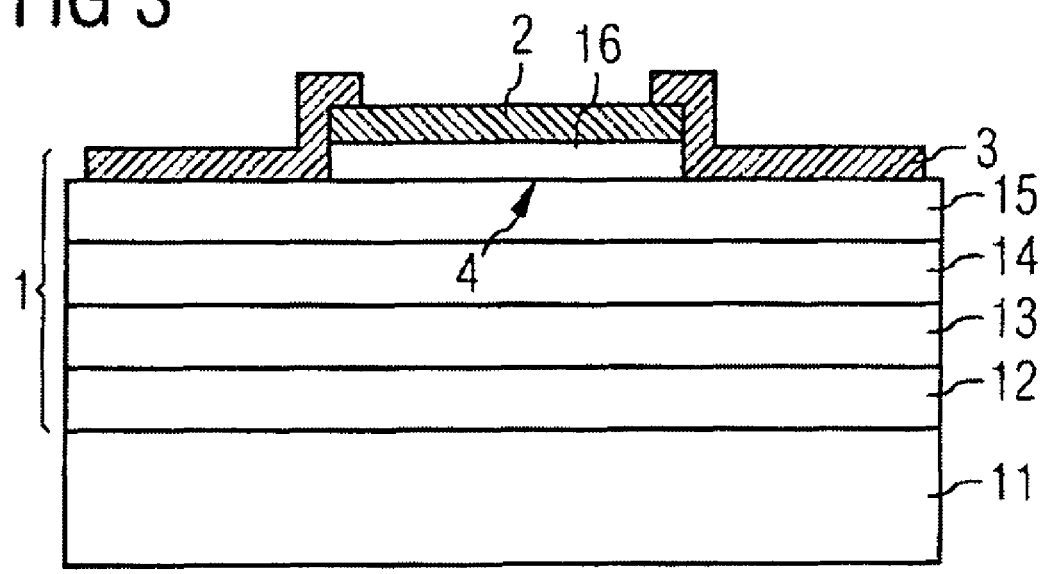
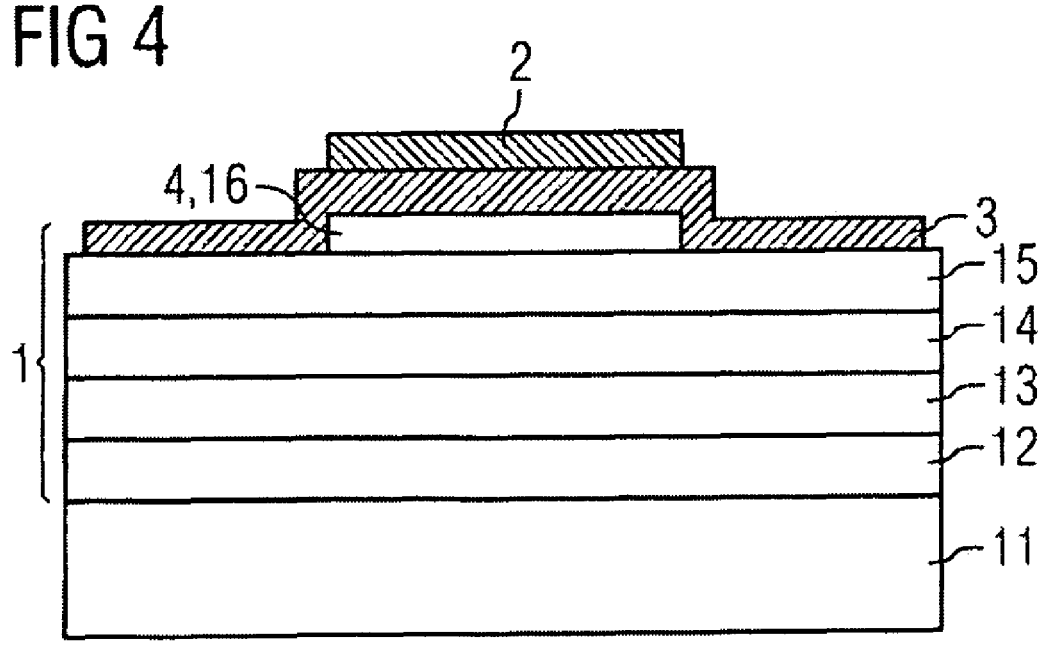

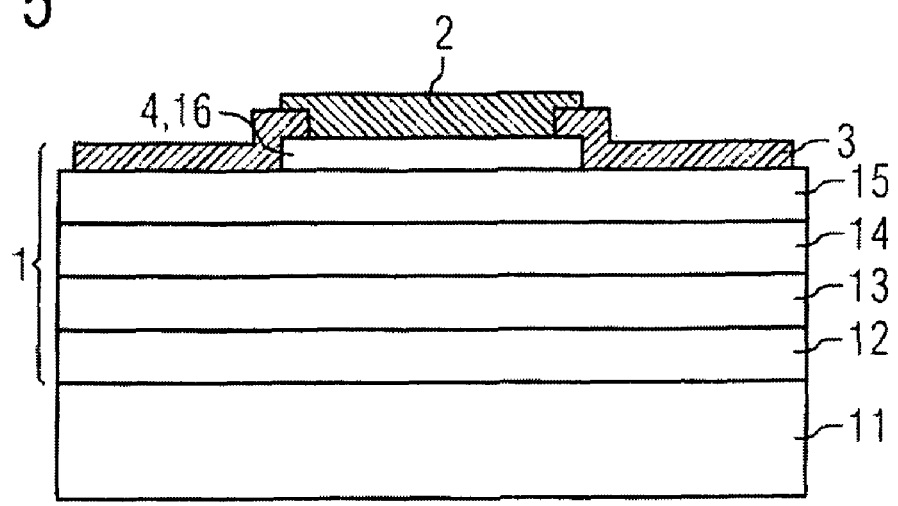
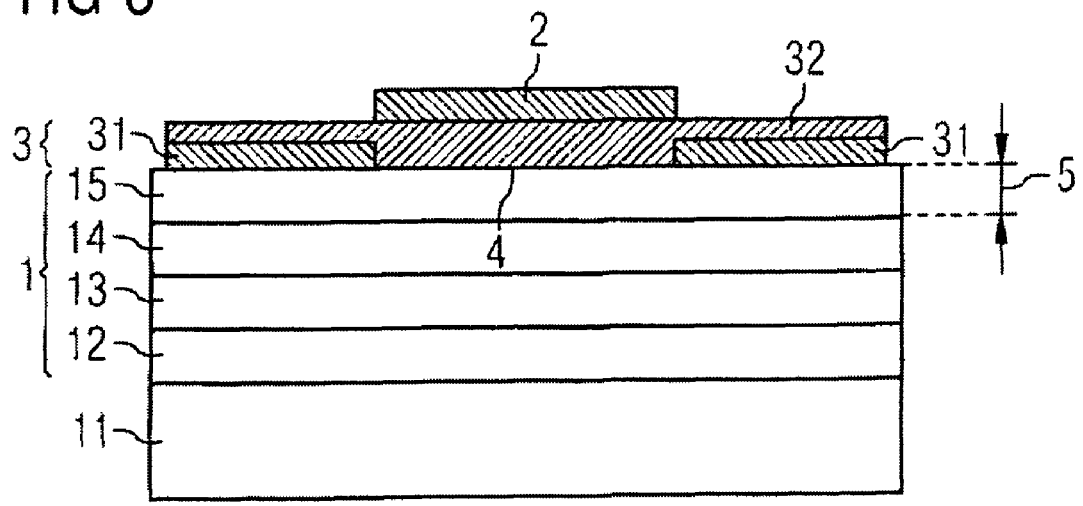

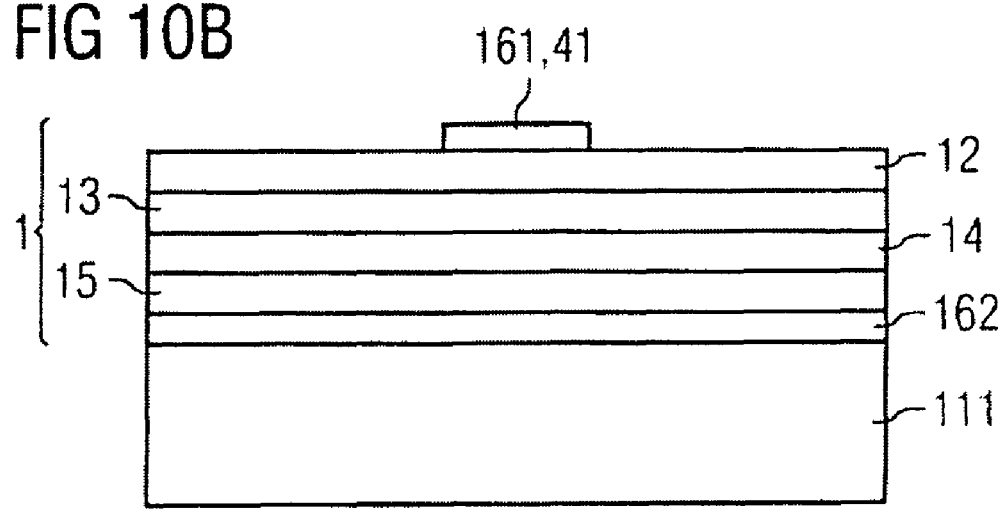
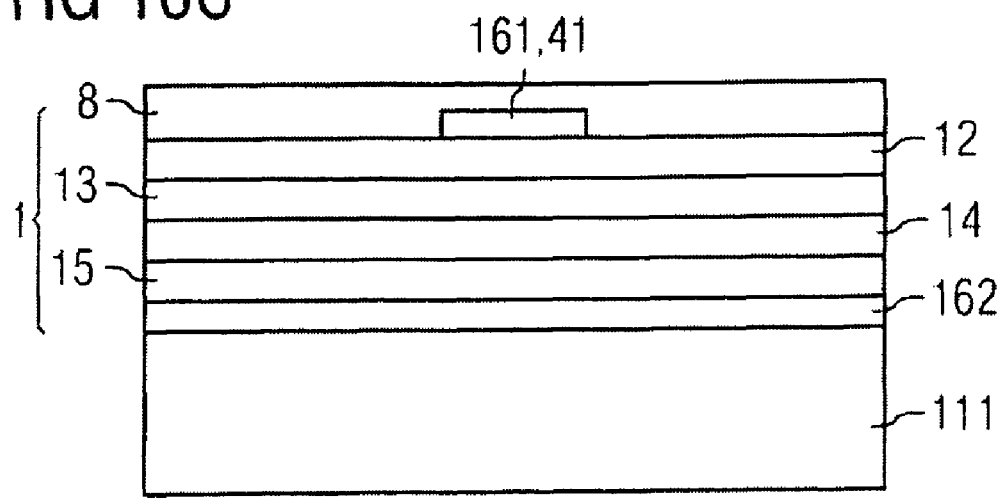

LUMINESCENCE DIODE CHIP WITH CURRENT SPREADING LAYER AND METHOD FOR PRODUCING THE SAME

CROSS-REFERENCE TO RELATED APPLICATIONS

This application is the National Stage of International Application No. PCT/DE2006/002046, filed on Nov. 21, 2006, which claims the priority to German Patent Application Serial No. 102005061797.2, filed on Dec. 23, 2005, the entire contents of which is hereby incorporated by reference in its entirety.

TECHNICAL FIELD

The present disclosure is directed to a light-emitting diode (LED) chip comprising an epitaxial semiconductor layer sequence suitable for generating electromagnetic radiation, an electrical connector body, and a radiation-transparent current spreading layer electrically conductively connected to said connector body. The current spreading layer contains at least one TCO (Transparent Conductive Oxide), i.e., a radiation-transparent, electrically conductive material, which is applied to the semiconductor layer sequence.

BACKGROUND

U.S. Pat. No. 6,459,098 B1 specifies a light-emitting diode with a multi-layer window element on a light outcoupling side. The window element includes a first semiconductor layer of p-conductively doped GaP, a second semiconductor layer of p-conductively doped GaAs, and an amorphous, electrically conductive layer of indium zinc oxide (ITO). The ITO layer and the second semiconductor layer are provided with an opening into which an electrical connector body is introduced so that it rests directly on the first semiconductor layer. A Schottky diode contact is formed between the connector body and the first semiconductor layer, so that current substantially is not coupled directly from the connector body into the first semiconductor layer, but instead is first injected laterally into the second semiconductor layer and the ITO layer. Reduced light generation is thus obtained in a region disposed perpendicularly below the connector body in the LED chip. The directional indication "perpendicularly below" the connector body relates in this case to a main direction of extension of semiconductor layers of the semiconductor layer sequence.

As an alternative to forming a Schottky diode contact between connector body and the first semiconductor layer, U.S. Pat. No. 6,459,098 B1 specifies forming an insulator layer of silicone oxide between the connector body and the first semiconductor layer. This also largely prevents direct current injection from the electrical connector body into the first semiconductor layer.

U.S. Pat. No. 5,717,226 discloses an LED chip that has, on a light outcoupling side, a similar multi-layer window element to that of the LED chip described in U.S. Pat. No. 6,459,098.

SUMMARY

It is an object of the present disclosure to specify an LED chip of the initially cited kind, by means of which an increased efficiency compared to conventional LED chips can be obtained in the generation and outcoupling of electromagnetic radiation, and which can be produced in a cost-effective manner. A corresponding method for producing an LED chip is also to be specified.

An LED chip is specified that has at least one current barrier. The current barrier is suitable for selectively preventing or reducing, by means of a reduced current density, the generation of radiation in a region laterally covered by the electrical connector body. "Laterally" is to be understood as meaning directions that extend parallel to a direction of extension of semiconductor layers of the epitaxial semiconductor layer sequence.

The connector body overlaps with the region in which the generation of radiation is to be selectively prevented or reduced by means of a reduced current density, i.e., the connector body partially or completely covers that region. In particular, the connector body completely overlaps laterally with that region. The region laterally covered by the connector body is disposed perpendicularly below the connector body in the semiconductor layer sequence. By means of the current barrier, less current is injected into the region below the connector body. This means that in that region, no, or at least less, electromagnetic radiation is generated, and less radiation is consequently absorbed by the electrical connector body than in the case of conventional electrical contact structures without current barriers. At the same time, the current spreading layer ensures particularly good current spreading. Particularly in the case of very small LED chips, which typically have a surface area of $\leq 0.004$ mm$^2$ in a main direction of extension of the semiconductor layers, the efficiency can be considerably improved in this way.

The current spreading layer particularly comprises no semiconductor material.

Preferably a plurality of current barriers is contained by means of which the generation of electromagnetic radiation in an undesired region below the connector body can be largely prevented or reduced.

Particularly advantageously, at least one current barrier is contained which comprises the material of the epitaxial semiconductor layer sequence, material of the current spreading layer and/or an interface between the semiconductor layer sequence and the current spreading layer. The current barrier preferably consists of material of the epitaxial layer sequence or material of the current spreading layer and/or is formed by an interface between the semiconductor layer sequence and the current spreading layer.

In this way, the current barrier can be formed independently of the arrangement and extent of the connector body. In addition, such a configuration of the current barrier makes it possible to produce the LED chip by a technically simple and cost-effective method.

The interface between the semiconductor layer sequence and the current spreading layer is not to be understood as an area in the exact mathematical sense, but a boundary region in which the interface effects are significant. In this sense, the interface also extends in small part into the body of the semiconductor layer sequence and the current spreading layer, for which reason the interface in the sense of the present disclosure has, as a rule, no thickness.

"Semiconductor material of the epitaxial semiconductor layer sequence" and "material of the current spreading layer" are to be understood in particular as including modified material that does not necessarily have all the usual properties of materials ordinarily contained in an epitaxial semiconductor layer sequence or in a current spreading layer comprising TCO. For example, material of the current spreading layer can be modified in such a way that, unlike the unmodified material, it is electrically insulating. Material of the epitaxial semiconductor layer sequence can, for example, be modified in such a way that the regular lattice structure is partially or completely destroyed.

The semiconductor layers of the semiconductor layer sequence that are disposed between the current spreading layer and a radiation-generating zone usefully have a layer resistance greater than 200 Ω/sq, preferably greater than 600 Ω/sq, particularly preferably greater than 2000 Ω/sq. The electric current can thus be largely prevented from flowing laterally into the region where radiation generation is not desired.

According to an advantageous embodiment, the LED chip contains at least one current barrier comprising undoped semiconductor material, or semiconductor material that is so weakly doped that its electrical conductivity is less than one-tenth the electrical conductivity of a semiconductor material adjacent to said current barrier in the semiconductor layer sequence.

Additionally or alternatively, at least one current barrier is advantageously contained which comprises semiconductor material that is conductively doped in such a way that during the operation of the LED chip, said semiconductor material forms with an adjacent semiconductor material a pn junction that is operated in the blocking direction.

Through the use of current barriers comprising semiconductor material, their production can advantageously be partially or completely integrated into the epitaxial process serving to produce the semiconductor layer sequence.

According to another embodiment, the LED chip contains at least one current barrier comprising an oxidized semiconductor material of the semiconductor layer sequence, or one that is modified by means of introduced ions or atoms in such a way that its electrical conductivity is less than one-tenth the electrical conductivity of a semiconductor material adjacent to the current barrier.

The semiconductor layer sequence preferably contains at least one current barrier comprising semiconductor material, a radiation-generating zone being disposed between the current barrier and the current spreading layer.

Additionally or alternatively, the LED chip particularly preferably contains at least one current barrier comprising a semiconductor material that is adjacent to the current spreading layer and/or to the electrical connector body.

Another advantageous embodiment provides that the LED chip contains at least one current barrier that includes a portion of the TCO, said portion of the TCO being oxidized and/or modified by means of introduced ions or atoms in such a way that its electrical conductivity is less than one-tenth the electrical conductivity of a remaining TCO of the current spreading layer.

The current spreading layer is preferably adjacent to a semiconductor layer of the epitaxial semiconductor layer sequence, the interface being composed of a first portion and a second portion. In the first portion, an electrically conductive contact is formed between the current spreading layer and the semiconductor layer. In the second portion, no electrically conductive contact is formed, or an electrically conductive contact has a conductivity of less than one-tenth the electrical conductivity of the contact in the first portion of the interface.

A useful embodiment provides that the electrical connector body completely or in large part overlaps laterally with the current spreading layer.

According to another embodiment, it is preferably provided that the current spreading layer partially or completely overlaps laterally with at least one current barrier. Particularly preferably, the current spreading layer partially or completely overlaps laterally with all the current barriers of the LED chip.

A portion of the current spreading layer is advantageously disposed on a side of the connector body which faces away from the semiconductor layer sequence. A particularly good electrically conductive connection between the connector body and the current spreading layer can be formed in this way.

In a preferred improvement of the LED chip, at least one current barrier is present that completely overlaps laterally with the connector body and protrudes laterally beyond the connector body. In this case, the extent of the current barrier parallel to a main plane of extension of layers of the semiconductor layer sequence is greater than the extent of the connector body along that main plane of extension.

In a useful embodiment of the LED chip, the latter advantageously additionally contains a current barrier formed by an interface between the semiconductor layer sequence and the electrical connector body. The term "interface" is to be understood here in exactly the same sense as the interface between the current spreading layer and the semiconductor layer sequence.

The LED chip preferably contains a radiation-generating zone disposed between two cladding layers, the epitaxial semiconductor layer sequence consisting, between one of the cladding layers and the current spreading layer, of an outer portion having a thickness less than or equal to 100 nm.

In particular, the semiconductor layer sequence of a thus-constituted LED chip has no current spreading layer comprising semiconductor material. Dispensing with such a current spreading layer makes it possible to configure the semiconductor layer sequence as thinner, thereby additionally saving on effort and expense during production. Particularly preferably, the outer portion of the semiconductor layer sequence can have a thickness less than or equal to 60 nm.

A method for producing an LED chip is specified, in which a semiconductor layer sequence is grown epitaxially, a current spreading layer comprising a TCO is applied to the semiconductor layer sequence, and an electrical connector body is disposed on the semiconductor layer sequence.

In the method, at least one current barrier is preferably formed in the semiconductor layer sequence, in the current spreading layer and/or in an interface between the semiconductor layer sequence and the current spreading layer. Such formation of a current barrier can advantageously be performed in a technically simple manner and particularly cost-effectively.

According to the method, the formation of the current barrier advantageously includes applying an undoped semiconductor layer of the semiconductor layer sequence, or one that is weakly doped in such a way that its electrical conductivity is less than one-tenth the electrical conductivity of an adjacent semiconductor material. The outer layer is usefully then removed.

Additionally or alternatively, the formation of the current barrier includes conductively doping a semiconductor layer of the semiconductor layer sequence in such a way that together with adjacent semiconductor material, it forms a blocking diode in the LED that is to be produced. An effective current barrier is thereby advantageously integrated with low technical expenditure into the epitaxial process for growing the semiconductor layer sequence. The outer layer is usefully partially removed afterwards or in advance.

According to a preferred embodiment of the method, the formation of the current barrier includes implanting ions or atoms in the semiconductor layer sequence after the epitaxial growth of the semiconductor layer sequence. Particularly preferably, the ions or atoms are implanted through a radiation-generating zone of the semiconductor layer sequence. It has been found, surprisingly, that this can be done without destroying the radiation-generating zone.

In a further advantageous embodiment of the method, the formation of the current barrier includes oxidizing a portion of an outer layer of the semiconductor layer sequence and/or a portion of the current spreading layer or providing, it by diffusion, with foreign ions or foreign atoms, in such a way that this portion has an electrical conductivity of less than one-tenth the electrical conductivity of an adjacent semiconductor material or another portion of the current spreading layer.

According to the method, a first portion of the current spreading layer is preferably applied to the semiconductor layer sequence in such a way that no electrically conductive contact to the semiconductor layer sequence forms, or an electrically conductive contact forms that has a conductivity which is less than one-tenth the electrical conductivity of the contact between the first portion of the current spreading layer and the semiconductor layer sequence.

Particularly preferably, the formation of the current barrier additionally or alternatively includes roughening a portion of an outer surface of the semiconductor layer sequence and applying the current spreading layer to that outer surface. The roughening can, in particular, be performed during the application of the current spreading layer, for example by sputtering the current spreading layer onto the corresponding outer surface at a sufficiently high sputtering energy.

In another advantageous embodiment, the current spreading layer is applied after the electrical connector body. Alternatively, the electrical connector body is usefully disposed entirely on the current spreading layer.

Further advantages, preferred embodiments and improvements of the LED chip and of the method will emerge from the exemplary embodiments described hereinafter in connection with FIGS. 1 to 13c.

BRIEF DESCRIPTION OF THE DRAWINGS

FIG. 3 is a schematic sectional view of the LED chip according to a third exemplary embodiment, FIG. 4 is a schematic sectional view of the LED chip according to a fourth exemplary embodiment, FIG. 5 is a schematic sectional view of the LED chip according to a fifth exemplary embodiment, FIG. 6 is a schematic sectional view of the LED chip according to a sixth exemplary embodiment, FIGS. 10a to 10f are schematic sectional views of various method stages of a second exemplary embodiment of the method.

DETAILED DESCRIPTION

Figure 1:
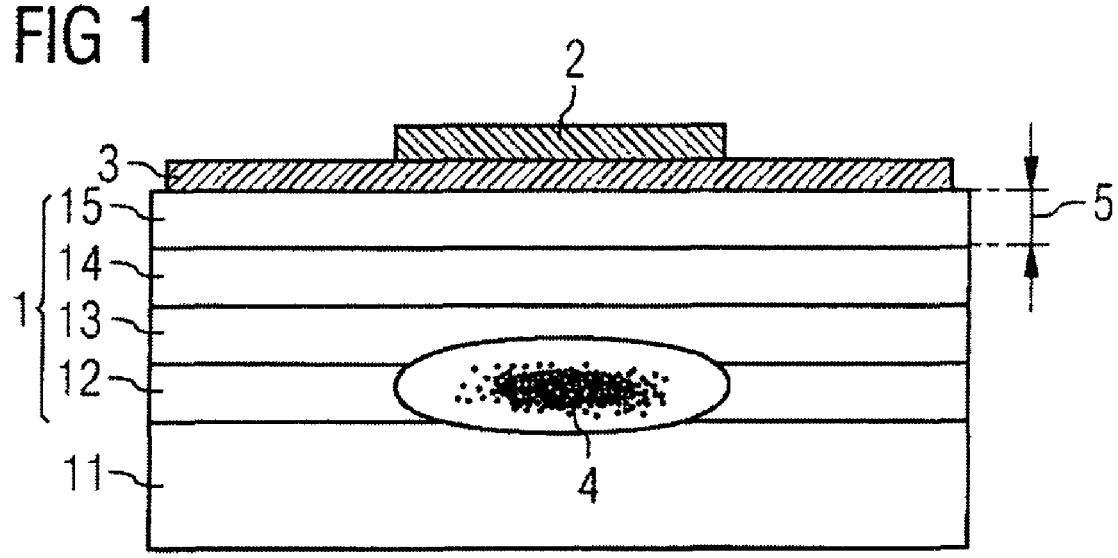
FIG. 1 is a schematic sectional view of the LED chip according to a first exemplary embodiment.

In the exemplary embodiments and FIGS., like or like-acting elements are provided with the same respective reference numerals. The illustrated elements and the size relationships of the elements to one another are not to be considered true to scale. Some details of the FIGS. may be depicted as exaggeratedly large for the sake of better understanding.

The LED chips depicted in FIGS. 1 to 8 each have a substrate 11 and an epitaxial semiconductor layer sequence 1 disposed on the substrate. The substrate 11 can be a growth substrate, i.e., in that case the semiconductor layer sequence 1 is epitaxially grown on the substrate 11.

Alternatively, the substrate 11 is a mere carrier substrate, that is, the semiconductor layer sequence 1 is not grown epitaxially on said substrate 11 but is applied to it, for example by bonding or gluing. In that case, the semiconductor layer sequence is also produced, for example by epitaxial growth, on a growth substrate that is different from growth substrate 11. The growth substrate can be partially or completely removed or can be entirely contained in the LED chip, for example on a side of the semiconductor layer sequence 1 facing away from the substrate 11 (not shown).

The LED chips each comprise an electrical connector body 2 and an electric current spreading layer 3, which is not electrically conductively connected to the electrical connector body 2.

The electrical connector body 2 is nontransparent to an electromagnetic radiation generated by the LED chip when operating. It is formed, for example, as a bond pad and comprises a metal or a plurality of a different metals, for example in the form of different layers and/or alloys. Any metals commonly employed in bond pads may be used.

The current spreading layer 3 is at least partially transparent to the radiation generated by the LED chip. It consists, for example, in large part of a TCO, that is, of a radiation-transparent, electrically conductive material such as tin oxide, indium oxide, indium tin oxide or zinc oxide. The current spreading layer 3 consists for example of $Al_{0.02}Zn_{0.98}O$ and has a thickness of, for example, 500 nm.

In addition, the current spreading layer 3 can, for example, comprise a metal, disposed for example in the form of a layer a few nanometers thick, between the TCO and the semiconductor layer sequence. Due to its very small thickness, such a metal layer is also radiation-transparent, even if the metallic material used is basically reflective or absorptive of electromagnetic radiation. However, the current spreading layer is preferably free of such a radiation-transparent metal layer between the TCO and the semiconductor layer sequence 1.

The semiconductor layer sequence 1 comprises, for example between the substrate 11 and the current spreading layer 3, in order starting from the substrate 11, a first cladding layer 12, an active layer 13 with a radiation-generating zone, a second cladding layer 14 and a contact layer 15. The semiconductor layers can each consist of a single semiconductor layer or can comprise a layer sequence having a plurality of semiconductor layers.

The semiconductor layer sequence is based, for example, on phosphite compound semiconductor materials. These are semiconductor materials that contain phosphor, for example from the system $Al_nGa_mIn_{1-n-m}P$, where $0 \leq n \leq 1$, $0 \leq m \leq 1$ and $n+m \leq 1$. The term "radiation-emitting LED chip based on phosphite compound semiconductor materials" is to be understood herein to mean in particular an LED chip in which the semiconductor layer sequence contains at least a single layer comprising a material from the phosphite compound semiconductor material system. The semiconductor layer sequence preferably contains a plurality of such layers.

The first and second cladding layers 12, 14 comprise, for example, differently conductively doped AlInP. The contact layer 15 contains, for example, $Al_{0.5}Ga_{0.5}As$. The active layer can comprise, for example, a conventional pn junction, a double heterostructure, a single quantum well structure (SQW structure) or a multiple quantum well structure (MQW structure). Such structures are known to those skilled in the art and thus will not be described in more detail here. The active layer contains, for example, different AlGaInP materials. The substrate 11 consists, for example, of GaAs. The contact layer 15 and the second cladding layer 14 each have a high transverse conductivity of, for example, approximately 700 Ω/sq.

Alternatively, the semiconductor layer sequence can also be based on other compound semiconductor material systems. One alternative material system that is suitable in principle is nitride compound semiconductor materials, such as, for example, materials from the system $In_xAl_yGa_{1-x-y}N$, where $0 \leq x \leq 1$, $0 \leq y \leq 1$ and $x+y \leq 1$.

In the LED chip depicted in FIG. 1, the current spreading layer 3 is formed as a planar layer on the contact layer 15 of the semiconductor layer sequence 1. The electrical connector body 2 is applied to the current spreading layer 3. It is immediately adjacent to the current spreading layer 3 and is not adjacent to the epitaxial semiconductor layer sequence 1. In other words, connector body 2 is spaced apart from semiconductor layer sequence 1.

In the exemplary embodiment illustrated in FIG. 1, the semiconductor layer sequence 1 has a region that functions as a current barrier 4. In this region, the semiconductor material of the semiconductor layer sequence 1 is modified, for example by means of introduced ions, in such a way that its electrical conductivity is, for example, less than 1/20th the electrical conductivity of unmodified regions of first cladding layer 12.

The current barrier 4 is disposed substantially in first cladding layer 12. It also extends partially into the adjacent substrate 11 and into the adjacent active layer 13.

The semiconductor material of current barrier 4 is, for example, modified by means of protons. In addition to this current barrier 4, the LED chip can also comprise still other current barriers, although this is not explicitly illustrated in FIG. 1.

The current barrier 4 shadows the current flow through the semiconductor layer sequence 1 of the LED chip during the operation of the latter in such a way that the generation of electromagnetic radiation in a region of the active layer that is at least partially covered by the connector body 2 is selectively reduced. Electromagnetic radiation generated in a region laterally covered by the electrical connector body 2 impinges on and is absorbed by the electrical connector body 2 with a particularly high probability compared to other regions. Through selective reduction of the radiation generated in this region, the radiation absorbed by the electrical connector body 2 is also, therefore, significantly reduced and the overall efficiency of the LED chip is increased.

In addition, the electric current through the current spreading layer 3 is effectively spread over the entire, or almost the entire, lateral cross section of the LED chip and is particularly coupled into regions in the semiconductor layer sequence 1 that are not covered by the electrical connector body 2.

The use of current spreading layer 3 comprising a TCO advantageously makes it possible to dispense with a current spreading layer of semiconductor material within the semiconductor layer sequence 1. Current spreading layers of semiconductor material are very highly electrically conductively doped, as a rule, which has the disadvantage that they usually have a higher absorption coefficient than a less strongly doped semiconductor material. In addition, current spreading layers made of semiconductor material ordinarily have a thickness of a few μm to ensure the best possible current spreading.

Dispensing with such a current spreading layer of semiconductor material therefore reduces the absorption of electromagnetic radiation within the semiconductor layer sequence, and, moreover, can also reduce production costs through the use of a more cost-effective epitaxial process to produce the semiconductor layer sequence.

The epitaxial semiconductor layer sequences 1 of the LED chips depicted in FIGS. 1 to 8 contain no current spreading layer of semiconductor material. The semiconductor layer sequence 1 of the LED chip illustrated in FIG. 1 consists of a contact layer 15 for example 5 to 50 nm thick, disposed between the second cladding layer 14 and the current spreading layer 3. As mentioned earlier hereinabove, the contact layer 15 can, in particular, also comprise a plurality of semiconductor layers.

Figure 2:
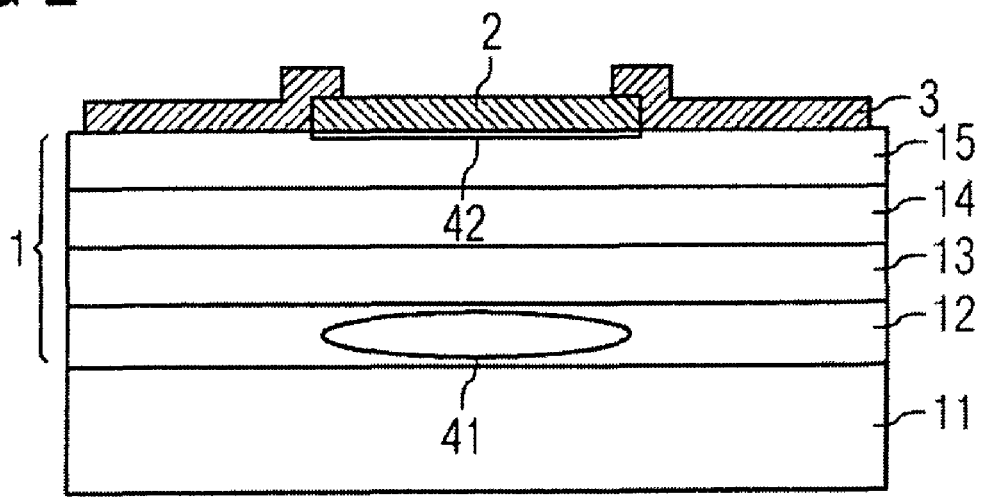
FIG. 2 is a schematic sectional view of the LED chip according to a second exemplary embodiment.

The LED chip illustrated in FIG. 2 comprises at least two current barriers 41, 42. A first current barrier 41 is formed in the semiconductor layer sequence 1. It can essentially be constituted in the same manner as the current barrier 4 described above with reference to FIG. 1. First current barrier 41 is, for example, disposed completely inside first cladding layer 12.

A second current barrier 42 is formed in a boundary region between connector body 2 and contact layer 15 of semiconductor layer sequence 1. Connector body 2 is immediately adjacent to semiconductor layer sequence 1. It is applied to contact layer 15 in such a way as to form at the interface a Schottky contact whose potential barrier increases in the operating direction when a voltage is applied to the LED chip. Charge transport between contact layer 15 and connector body 2 is largely reduced in this way.

In the LED chip illustrated in FIG. 2, the current spreading layer 3 is applied to the connector body 2. In those regions of the outer surface of contact layer 15 which are not occupied by connector body 2, current spreading layer 3 is immediately adjacent to semiconductor layer sequence 1.

Current spreading layer 3 extends on an outer surface of electrical connector body 2 that faces away from semiconductor layer sequence 1. This produces a lateral overlap between current spreading layer 3 and connector body 2, thereby increasing the electrically conductive connection between the current spreading layer and the connector body without metallic connector body 2 extending laterally beyond the region of current barrier 42, as when the electrical connector body is, for example, disposed on the current spreading layer 3 and partially protrudes beyond current spreading layer 3.

As in the exemplary embodiment described with reference to FIG. 2, in the case of the LED chip illustrated in FIG. 3 the current spreading layer 3 also extends on an outer surface of electrical connector body 2 that faces away from the semiconductor layer sequence 1.

The LED chip further comprises a current barrier 4 formed by a pn junction that blocks when the LED chip is in operation. To this end, the semiconductor layer sequence 1 contains, for example, a semiconductor layer 16 which is electrically conductively doped in such a way that, together with the adjacent contact layer 15, it forms the blocking pn junction. For example, the semiconductor layer 16 is n-Conductively doped and the contact layer 15 p-conductively doped.

Semiconductor layer 16 is immediately adjacent to electrical connector body 2. In addition to current barrier 4 in the form of a blocking pn junction, a Schottky contact can be formed between connector body 2 and semiconductor layer 16. The side faces of semiconductor layer 16 and of connector body 2 are covered by the current spreading layer 3.

The LED chip depicted in FIG. 4 also contains a current barrier 4 with a semiconductor layer 16 of semiconductor layer sequence 1. The current barrier 4 can be configured, for example, as in the exemplary embodiment described above in connection with FIG. 3. Alternatively, the semiconductor layer 16 is not, or is only weakly, electrically conductively doped, so that it has no electrical conductivity or its electrical conductivity is, for example, less than one-twentieth the electrical conductivity of contact layer 15. In that case, the current barrier 4 is formed substantially by semiconductor layer 16, as illustrated in FIG. 4.

In contrast to the exemplary embodiment described above with reference to FIG. 3, the connector body 2 in the LED chip illustrated in FIG. 4 is spaced apart from the semiconductor layer 16. The current spreading layer 3 extends between connector body 2 and the semiconductor layer 16. For example, semiconductor layer 16 is completely covered by current spreading layer 3. The electrical connector body 2 is, for example, disposed directly on current spreading layer 3. In this way, a large-area interface forms, and a particularly good electrically conductive contact is able to form between connector body 2 and the current spreading layer 3.

In the LED chip illustrated in FIG. 5, the current barrier 4 can be configured as in the exemplary embodiment described with reference to FIG. 4 or FIG. 3. The current spreading layer 3 partially extends on a side of semiconductor layer 16 which faces away from semiconductor layer sequence 1 and by which current barrier 4 is partially or substantially formed. The electrical connector body 2 is applied to the semiconductor layer sequence 1 in such a way that one portion is immediately adjacent to the semiconductor layer 16 and another portion overlaps laterally with the portion of current spreading layer 3 applied to semiconductor layer 16.

In addition to current barrier 4, in the LED chip illustrated in FIG. 5, a Schottky contact with a potential barrier that blocks during the operation of the LED chip can also be formed between semiconductor layer 16 and electrical connector body 2.

Figure 7:
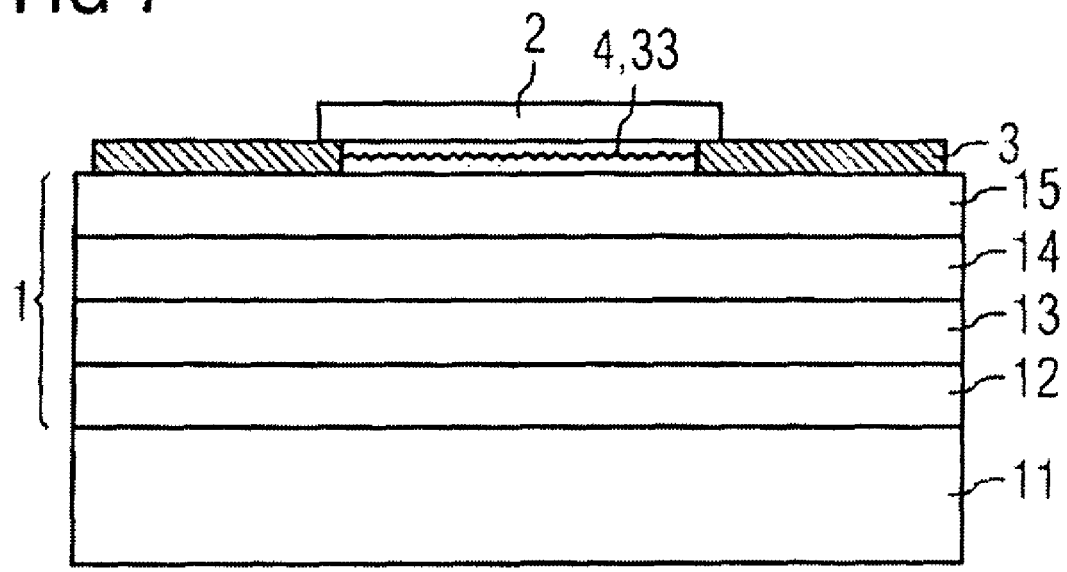
FIG. 7 is a schematic sectional view of the LED chip according to a seventh exemplary embodiment.
Figure 8:
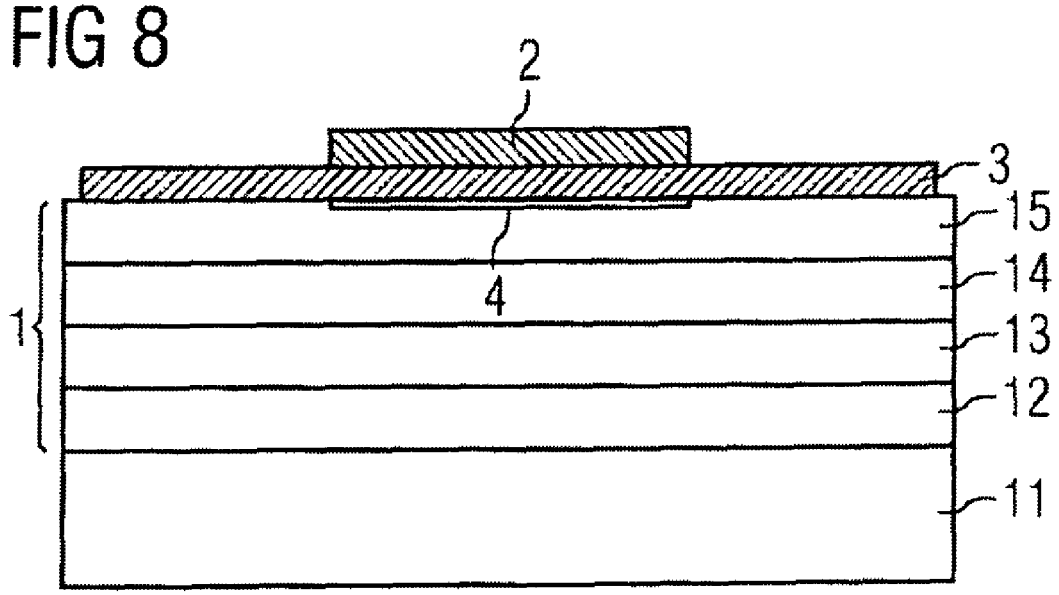
FIG. 8 is a schematic sectional view of the LED chip according to an eighth exemplary embodiment.

In the LED chips illustrated in FIGS. 6 to 8, the connector body 2 in each case is spaced apart from the semiconductor layer sequence 1. In each case, a current spreading layer 3 is applied to the semiconductor layer sequence 1, and the connector body 2 is disposed on the current spreading layer 3.

In each of the LED chips illustrated in FIGS. 6 and 8, a current barrier 4 is formed by an interface between the current spreading layer 3 and the semiconductor layer sequence 1. In the exemplary embodiment according to FIG. 6, the current spreading layer 3 comprises a first portion 31 and a second portion 32, each of which contains a TCO. Said TCO is, for example, constituted by like materials or the same material, for example a zinc oxide, in both portions 31, 32 of the current spreading layer 3.

Formed between the first portion 31 of current spreading layer 3 and the contact layer 15 of semiconductor layer sequence 1 is a well-conducting electrical contact that preferably has ohmic properties, i.e., exhibits a substantially linear dependence of electrical current on applied voltage. The first portion 31 of the current spreading layer 3 is in the form of a planar layer, which is provided with an opening in a central region on the outer surface of the semiconductor layer sequence 1.

The second portion 32 of current spreading layer 3 is applied to the first portion 31 in such a way that it fills the opening and is therefore also immediately adjacent to the semiconductor layer sequence 1. However, no electrically conductive contact, or a contact having low electrical conductivity, is formed between the second portion of current spreading layer 3 and the contact layer 15 of semiconductor layer sequence 1. For example, the electrical conductivity of the boundary region between the second portion 32 of current spreading layer 3 and the semiconductor layer sequence 1 is less than one-twentieth the electrical conductivity of the contact formed at the interface between first portion 31 and semiconductor layer sequence 1.

Such different electrical conductivities for the boundary regions between the first portion 31 of current spreading layer 3 and the semiconductor layer sequence 1, on the one hand, and the second portion 32 of current spreading layer 3 and the semiconductor layer sequence 1, on the other hand, can be obtained, for example, by means of a method in which the two portions 31, 32 of current spreading layer 3 are applied in different ways, as explained in more detail below in connection with the exemplary method.

The LED chip illustrated in FIG. 8 differs from the previous one, depicted in FIG. 6, in that the current spreading layer 3 is formed in one piece and can in particular be applied in a single method step. A well-conducting electrical contact is still formed between the current spreading layer 3 and the semiconductor layer sequence 1 in outer regions of the LED chip, whereas this is not the case in a central region of the LED chip.

In the central region, a current barrier 4 is formed between the current spreading layer 3 and the semiconductor layer sequence 1. For example, in this region, current spreading layer 3 forms with contact layer 15 a Schottky contact that is in blocking mode when an operating voltage is applied to the LED chip. The boundary region between current spreading layer 3 and semiconductor layer sequence 1 has, for example, an electrical conductivity in the central region of current barrier 4 that is less than one twenty-fifth the electrical conductivity between current spreading layer 3 and the semiconductor layer sequences in the other regions.

Such a selective electrical connection of the current spreading layer 3 to the semiconductor layer sequence 1 can be obtained, for example, by pretreating the surface of the semiconductor layer sequence 1 in the region intended for the current barrier 4 before the current spreading layer 3 is applied. This, too, is explained in more detail below in connection with the exemplary embodiments of the method.

The exemplary embodiment of the LED chip depicted in FIG. 7 comprises a current barrier 4 that consists of material of the current spreading layer 3. To this end, a subregion 33 of the current spreading layer is modified so that the electrical conductivity of that portion 33 is significantly reduced, for example by 95%.

In this exemplary embodiment, the electrical connector body 2 is applied to the modified portion 33, i.e. to the current barrier 4. So that a well-conducting electrical contact to the remaining portion of the current spreading layer 3 is still formed, the connector body 2 projects laterally beyond the current barrier 4, so that there is lateral overlap with the well-conducting portion of the current spreading layer 3. In the region of the overlap, the connector body 2 is electrically conductively connected to the well-conducting portion of current spreading layer 3.

Figure 9A:
FIGS. 9a to 9e are schematic sectional views of various method stages of a first exemplary embodiment of the method.
Figure 9B:
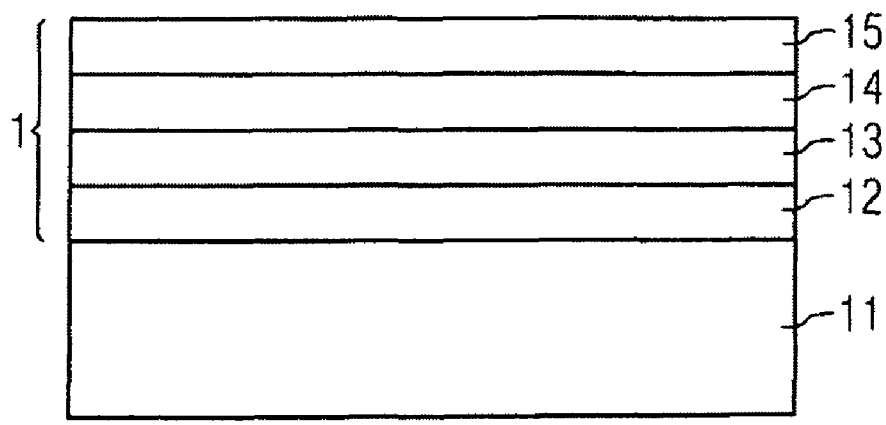
Figure 9C:
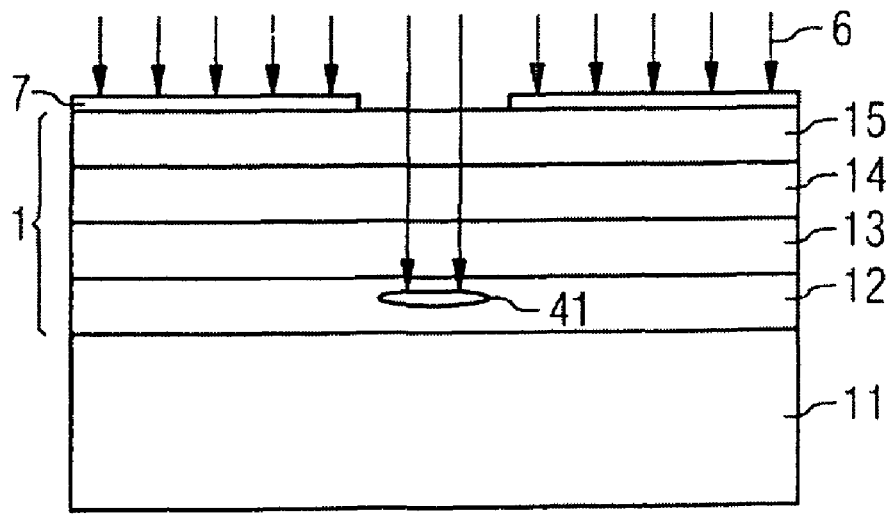

FIGS. 9A to 9E show various method stages of an exemplary method, according to which a growth substrate 11 is first prepared (see FIG. 9A). A semiconductor layer sequence 1 is then grown epitaxially on the substrate 11 (see FIG. 9B). Alternatively, it is also possible to prepare a finished semiconductor layer sequence 1 with or without a substrate 11.

In a further method stage, ions are implanted in the semiconductor layer sequence 1. So that this does not occur over the entire lateral cross section of the LED chip, the semiconductor layer sequence 1 is first provided with a mask 7. This is non-transparent to the ion beams 6 and comprises an opening over the region intended for a first current barrier 41.

Candidate ions for this purpose are all types of ions suitable for destroying or at least significantly lowering an electrical conductivity in a subregion of the semiconductor layer sequence 1. For example, protons are used. In the described exemplary embodiment, the semiconductor layer sequence 1 is bombarded with protons at such a high energy that they pass through the active layer 13, which contains a radiation-generating zone, and are implanted in the first cladding layer 12, disposed between the active layer 13 and the substrate 11. A first current barrier 41 is thereby formed in the semiconductor layer sequence 1 (see FIG. 9C).

Figure 9D:
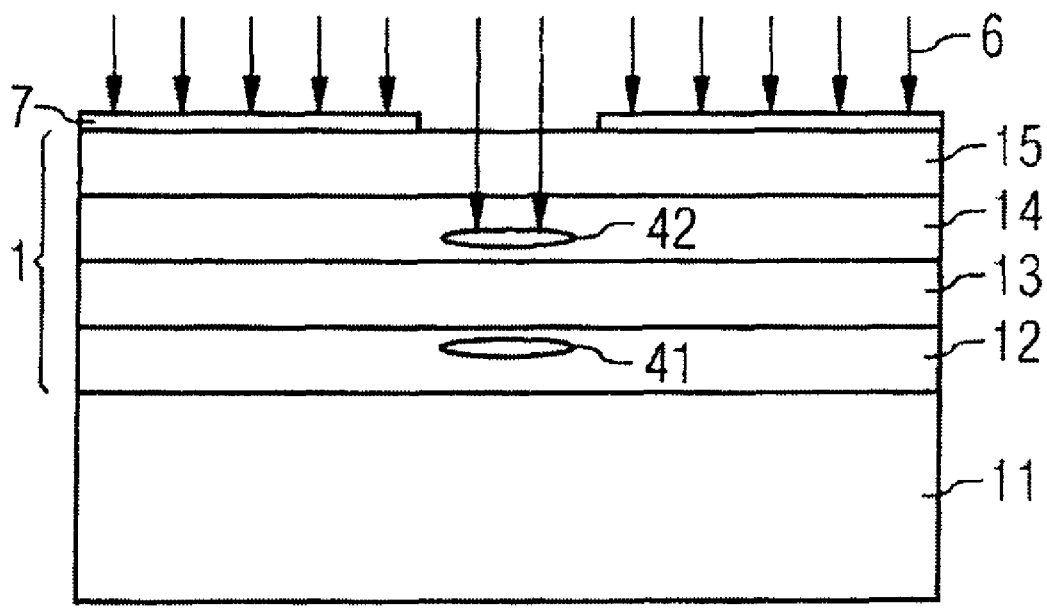
Figure 9E:
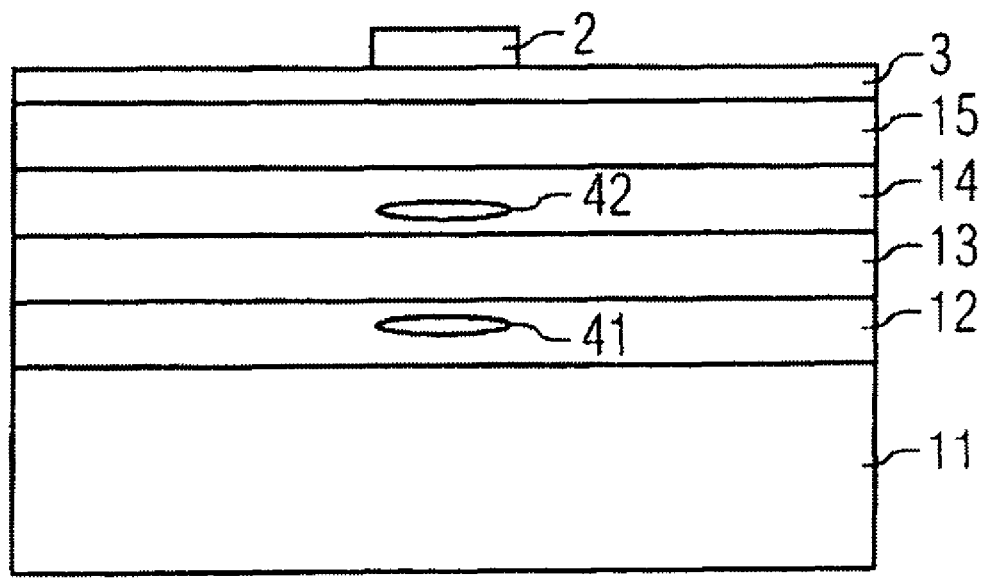

FIG. 9D schematically illustrates how a second current barrier 42 is formed in the semiconductor layer sequence 1 in a second implanting step. The same mask can, for example, be used for this purpose. For example, negatively charged ions are used.

The second current barrier 42 is disposed in a second cladding layer 14, which is contained in the semiconductor layer sequence 1 on an opposite side of active layer 13 from first cladding layer 12. The two current barriers 41, 42 effectively shadow a central region of the active layer 13 against electric current, so that the generation of electromagnetic radiation in that region is significantly reduced during operation, compared to an LED chip without current barriers.

After the formation of the two current barriers, the mask material 7 is removed, for example by etching. A current spreading layer 3 is then applied to the semiconductor layer sequence 1, for example by sputtering. A connector body 2 is formed on the current spreading layer 3, for example by vapor deposition of metallic material, and, if appropriate, is structured (see FIG. 9E).

Figure 10D:
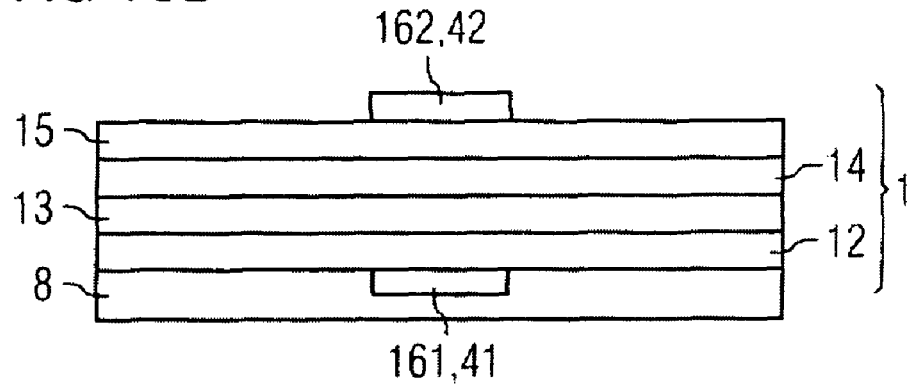

In the method illustrated graphically in FIGS. 10A to 10F, for example a growth substrate 111 is prepared, to which an epitaxial semiconductor layer sequence 1 is subsequently applied (see FIGS. 10A and 10B). The semiconductor layer sequence 1 comprises, in order starting from growth substrate 111, a second semiconductor layer 162 intended as a current barrier, a contact layer 15, a second cladding layer 14, an active layer 13, a first cladding layer 12 and a first semiconductor layer 161 intended as a current barrier.

The first and second semiconductor layers 161, 162 intended as current barriers consist, for example, of an undoped semiconductor material which is not, or is only very poorly, electrically conductive. Alternatively, these semiconductor layers are conductively doped in such a way that they each form, with a respective adjacent semiconductor layer, a blocking pn junction in the LED chip to be produced.

The first semiconductor layer 161 intended as a current barrier is epitaxially grown for example as the last layer of the semiconductor layer sequence 1. This layer is then partially removed, for example by lithography, such that a portion of the layer remains in the center of the semiconductor layer sequence 1 and thus forms a first current barrier 41 (see FIG. 10B).

In a further method step, a rear-side electrical connector body 8 is disposed on the first current barrier 41 and the exposed portion of the first cladding layer 12. This is depicted in FIG. 10C. The rear-side connector body comprises, for example, a metal that is suitable both for forming an electrically conductive contact to the first cladding layer 12 and for reflecting an electromagnetic radiation that can be generated with the LED chip to be produced.

In a further method step, the growth substrate 111 is separated from the semiconductor layer sequence 1. In addition, the second semiconductor layer 162 intended as a current barrier is structured in a similar manner to the first semiconductor layer 161 by means of a lithographic process, i.e., it is partially removed, so that a central region remains. This remaining portion of the semiconductor layer 162 forms a second current barrier 42.

Alternatively, it is also possible according to the method not to epitaxially grow on a substrate a second semiconductor layer 162 intended as a current barrier, but to use, for example, an electrically non-conducting or poorly conducting substrate and to use a portion of that substrate for the second current barrier 42. This is achieved for example by thinning the substrate. The rest of the substrate can then, for example, be structured analogously to the semiconductor layers 161, 162.

A current spreading layer 3 is then applied to the contact layer 15 and the second current barrier 42. An electrical connector body 2 is formed on the current spreading layer 3 above the second current barrier 42 (see FIG. 10E).

Figure 10E:
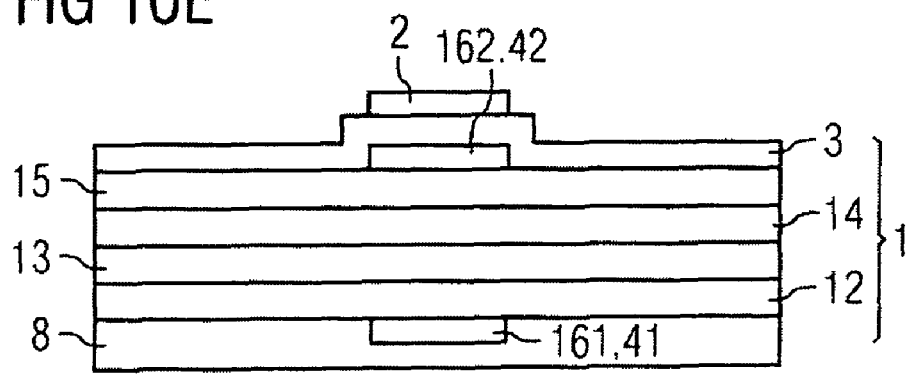

The LED chip shown in FIG. 10E is already in the finished state. It has no substrate on a side of the semiconductor layer sequence 1 facing away from the current spreading layer 3. The thus-configured LED chip can, for example, be mounted in a housing.

Figure 10F:
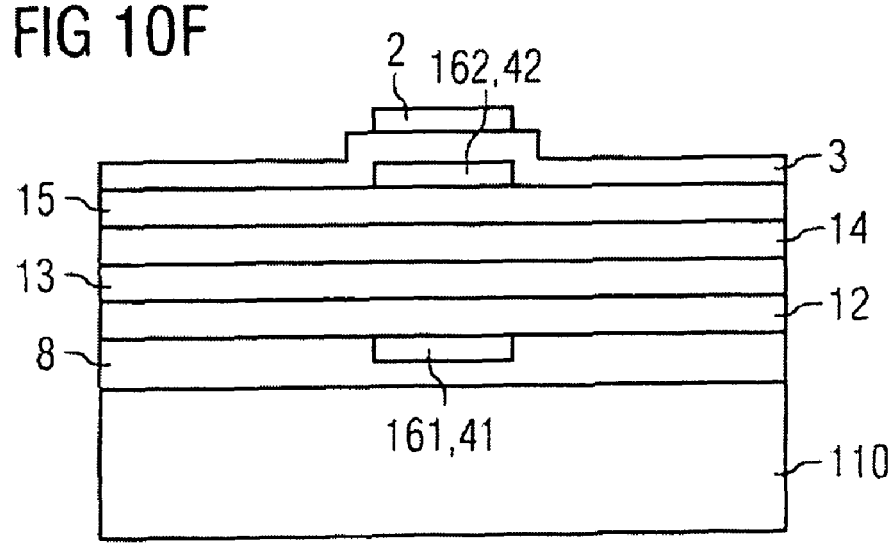

The structure depicted in FIG. 10E can also optionally be disposed on a carrier substrate 110, as illustrated in FIG. 10F. This is done for example by bonding, for example by means of a suitable solder or by gluing. For gluing purposes, it is also possible in particular to use an electrically conductive glue, which is especially suitable if the carrier substrate 110 is also electrically conductive.

Figure 11A:
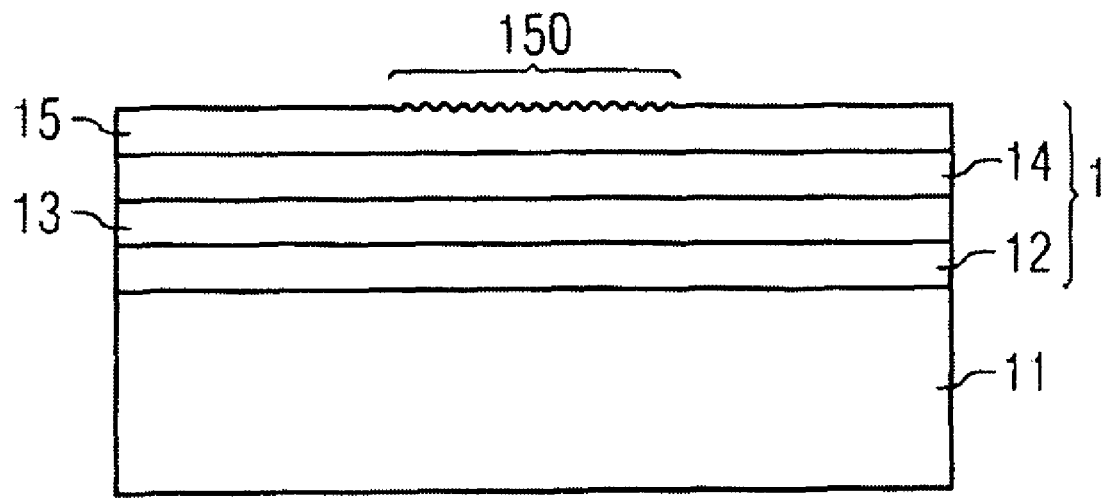
FIGS. 11a to 11b are schematic sectional views of various method stages of a third exemplary embodiment of the method.
Figure 11B:
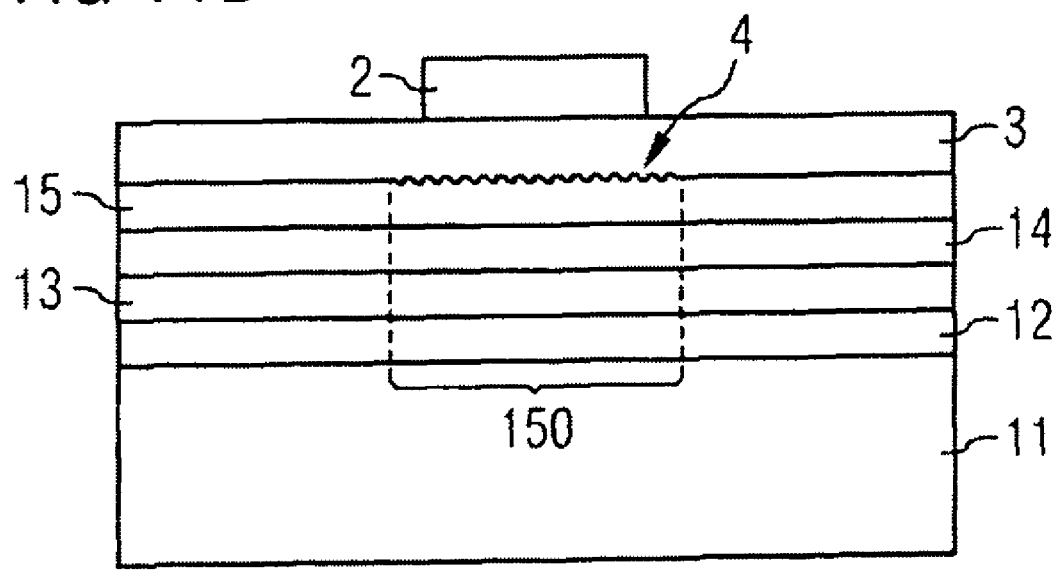

In an exemplary embodiment of the method that is illustrated in FIGS. 11A and 11B, a semiconductor layer sequence 1 is prepared. An outer surface of the semiconductor layer sequence 1, for example a contact layer 15, is then pretreated in a subregion 150 intended for the formation of a current barrier. During pretreatment, the subregion 150 of the outer surface of the semiconductor layer sequence 1 is, for example, roughened. The roughening is performed, for example, by particle bombardment, for which purpose for example an argon plasma can be used.

The subregion 150 so pretreated has a fine roughness with a very small structure size and structure depth. A structural element size and the structure depth are for example, less than 200 nm or 100 nm. Thereafter, for example a TCO such as zinc oxide is applied to the contact layer 15, which can be done by sputtering. In the pretreated subregion 150, either no electrically conductive contact or a much poorer electrically conductive contact than in the other regions is formed between the current spreading layer 3 and the contact layer 15. A current barrier 4 is thereby created in a technically simple manner in subregion 150. On the current spreading layer 3, a connector body 2 is formed for example above the current barrier 4 (see FIG. 11B).

Figure 12A:
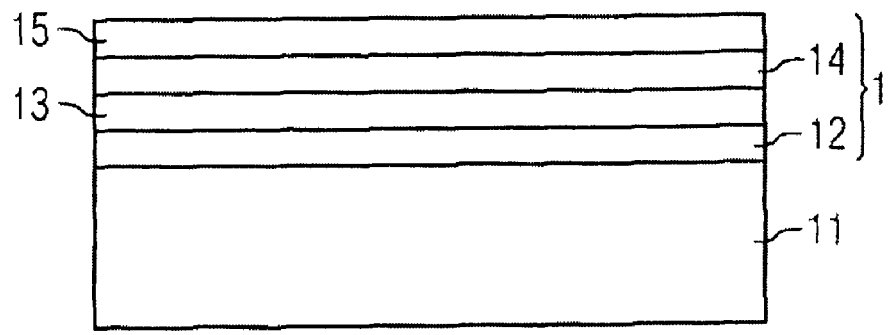
FIGS. 12a to 12c are schematic sectional views of various method stages of a fourth exemplary embodiment of the method.
Figure 12B:
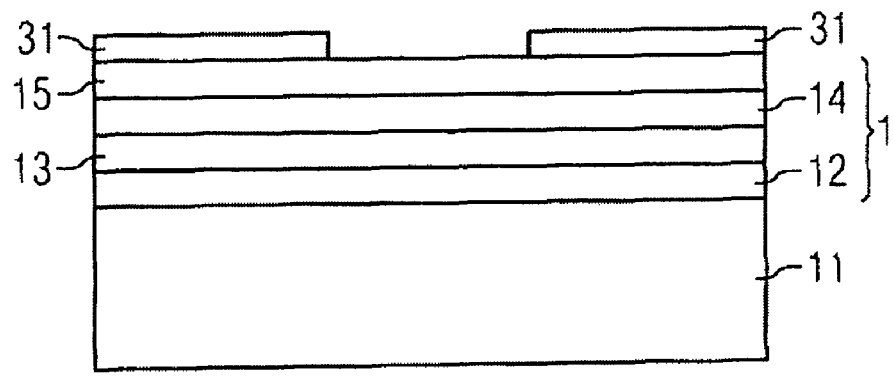
Figure 12C:
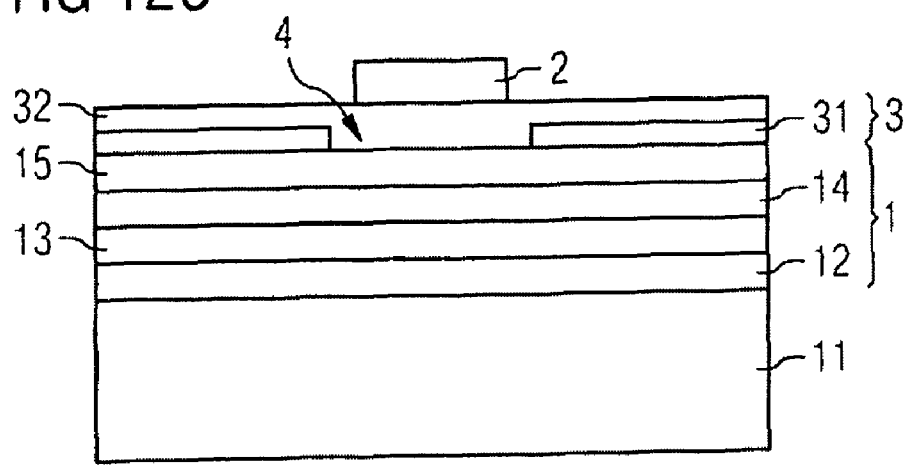

FIGS. 12A to 12C depict a method in which a multi-part current spreading layer 3 is produced and/or in which the current spreading layer 3 is applied in a plurality of separate method steps.

According to the method, a semiconductor layer sequence 1 is first prepared (see FIG. 12A). Then, a first portion 31 of a current spreading layer 3 is applied in a conventional manner to the semiconductor layer sequence 1 in such a way that a well-conducting electrical contact to the semiconductor layer sequence 1 forms. The first portion 31 of the current spreading layer 3 is applied in the form of a planar layer, which is subsequently removed in a region intended as a current barrier (see FIG. 12B). The application of the first portion 31 of current spreading layer 3 is effected, for example, by sputtering of a TCO such as zinc oxide. In the sputtering process, the articles to be sputtered have a kinetic energy of, for example, a few electron volts, for example less than 5 eV.

A second portion 32 of the current spreading layer 3 is then applied to the first portion 31. Sputtering is also used for this purpose, although this sputtering process is performed at a much higher sputtering energy than the sputtering process used to apply the first portion 31 of current spreading layer 3. In other words, the particles to be sputtered have a much higher kinetic energy in the second sputtering process. That energy is roughly an order of magnitude higher than the kinetic energy present in the first sputtering process. For example, the kinetic energy in the second sputtering process is 10 to 20 times greater.

With this method, no electrically conductive contact, or a much poorer electrically conductive contact than between the first portion 31 and the semiconductor layer sequence 1, forms between the second portion 32 of current spreading layer 3 and the semiconductor layer sequence 1. An interface between the second portion 32 of current spreading layer 3 and the contact layer 15 of semiconductor layer sequence 1 forms a current barrier 4 in this LED chip. A connector body 2 is subsequently formed on the current spreading layer 3 above current barrier 4 (see FIG. 12C).

Figure 13A:
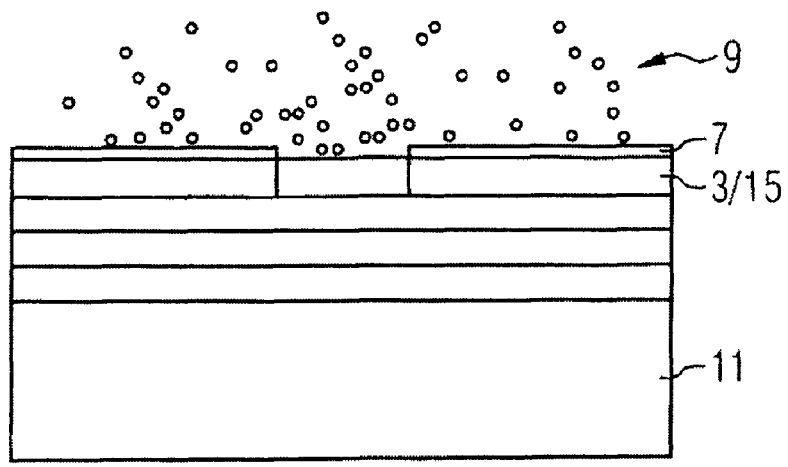
FIGS. 13a to 13c are schematic sectional views of various method stages of a fifth exemplary embodiment of the method.
Figure 13B:
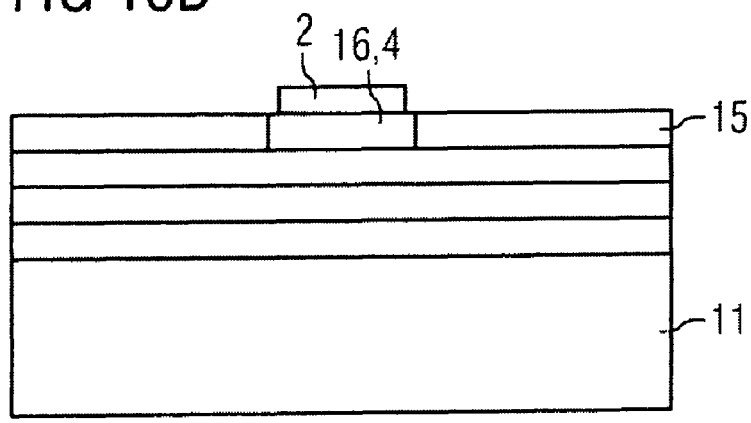
Figure 13C:
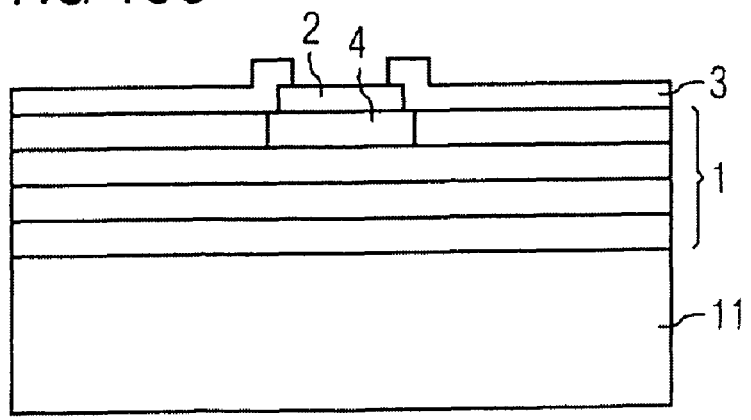

In the exemplary embodiment of the method illustrated in FIGS. 13A to 13C, a current barrier 4 is formed by modifying a subregion of a current spreading layer 3 or of a contact layer 15 of a semiconductor layer sequence by diffusing atoms or ions 9 into it (see FIG. 13A).

To bring this about, a mask 7, made of a suitable mask material that is nontransparent to the diffusion particles 9, is formed on the layer to be modified. Particles are selected for the diffusion process that are suitable for significantly reducing an electrical conductivity of the current spreading layer 3 or of the semiconductor layer 15. Lithium or copper is diffused in, for example.

Alternatively, it is also possible to oxidize the to-be-modified portion of the layer. For this purpose, the places not protected by the mask 7 are treated with an $O_2$ plasma or in an oxidation oven at a sufficiently high temperature. In this way, selective reduction or destruction of the conductivity of the material can also be achieved, so that a current barrier 4 can be formed (see FIG. 13B).

An electrical connector body 2 is formed directly on the current barrier 4, and to it a current spreading layer 3 is then applied (see FIG. 13C). A portion of the connector body 2 is exposed in a method step by selectively removing the current spreading layer 3, so that the LED chip can be electrically conductively contacted from the outside via the connector body 2.

The invention is not limited to the exemplary embodiments by the description of it with reference thereto. Rather, the invention encompasses any novel feature and any combination of features, including in particular any combination of features recited in the claims, even if that feature or combination itself is not explicitly mentioned in the claims or exemplary embodiments. The invention can, in particular, also encompass an LED chip that does not comprise a current barrier formed from material of the current spreading layer and/or formed by an interface between the semiconductor layer sequence and the current spreading layer. It is possible for the LED chip, for example, to have only one current barrier, formed by an interface between the semiconductor layer sequence and the electrical connector body, e.g. by a Schottky contact. Such a current barrier can also advantageously be combined with various described features.

The invention claimed is:

1. An LED chip, comprising an epitaxial semiconductor layer sequence suitable for generating electromagnetic radiation, an electrical connector body, a radiation-transparent current spreading layer electrically conductively connected to said connector body and comprising a TCO, at least one current barrier suitable for selectively preventing, by means of a reduced current density, the generation of radiation in a region laterally covered by said connector body, wherein said current barrier is formed from semiconductor material of said epitaxial semiconductor layer sequence, from material of said current spreading layer and/or by an interface between said semiconductor layer sequence and said current spreading layer, and at least one current barrier which comprises semiconductor material that is conductively doped such that said semiconductor material, together with an adjacent semiconductor material, forms a pn junction that is operated in the blocking direction during the operation of the LED chip.

2. The LED chip as in claim 1, comprises a plurality of current barriers.

3. The LED chip as in claim 1, comprises at least one current barrier which comprises undoped semiconductor material or semiconductor material that is weakly doped in such a way that its electrical conductivity is less than one-tenth the electrical conductivity of a semiconductor material present in the semiconductor layer sequence and disposed adjacent to said current barrier.

4. The LED chip as in claim 1, comprises at least one current barrier which comprises an oxidized semiconductor material of the semiconductor layer sequence and/or one that is modified by means of introduced ions or atoms in such a way that its electrical conductivity is less than one-tenth the electrical conductivity of a semiconductor material adjacent to said current barrier.

5. The LED chip as in claim 1, wherein said semiconductor layer sequence contains at least one current barrier comprising semiconductor material, and a radiation-generating zone is contained between said current barrier and said current spreading layer.

6. The LED chip as in claim 1, comprises at least one current barrier which comprises a semiconductor material adjacent to said current spreading layer and/or to said electrical connector body.

7. The LED chip as in claim 1 comprises at least one current barrier which includes a portion of said TCO, said portion of said TCO being oxidized and/or being modified by means of introduced ions or atoms in such a way that its electrical conductivity is one-tenth the electrical conductivity of a remaining TCO of said current spreading layer.

8. The LED chip as in claim 1, wherein said current spreading layer is adjacent to a semiconductor layer of said epitaxial semiconductor layer sequence and in that said interface comprises a first portion, in which an electrically conductive contact is formed between said current spreading layer and said semiconductor layer, and a second portion, in which no electrically conductive contact, or an electrically conductive contact whose conductivity is less than one-tenth the electrical conductivity of said contact in said first portion, is formed between said current spreading layer and said semiconductor layer.

9. The LED chip as in claim 1, wherein said electrical connector body completely or in large part overlaps laterally with said current spreading layer.

10. The LED chip as in claim 1, wherein said current spreading layer partially or completely overlaps laterally with at least one said current barrier.

11. The LED chip as in claim 1, wherein a portion of said current spreading layer is disposed on a side of said connector body facing away from said semiconductor layer sequence.

12. The LED chip as in claim 1, comprises at least one current barrier which completely overlaps laterally with said connector body and projects laterally beyond said connector body.

13. The LED chip as in claim 1, comprises a current barrier which is formed by an interface between said semiconductor layer sequence and said electrical connector body.

14. The LED chip as in claim 1, wherein a radiation-generating zone is disposed between two cladding layers, said epitaxial semiconductor layer sequence consisting, between one of said cladding layers and said current spreading layer, of an outer portion having a thickness less than or equal to 100 nm.

15. The LED chip as in claim 14, wherein said outer portion of said semiconductor layer sequence has a thickness less than or equal to 60 nm.

16. An LED chip, comprising an epitaxial semiconductor layer sequence suitable for generating electromagnetic radiation, an electrical connector body, a radiation-transparent current spreading layer electrically conductively connected to said connector body and comprising a TCO, at least one current barrier suitable for selectively preventing, by means of a reduced current density, the generation of radiation in a region laterally covered by said connector body, wherein said current barrier is formed from semiconductor material of said epitaxial semiconductor layer sequence, from material of said current spreading layer and/or by an interface between said semiconductor layer sequence and said current spreading layer and at least one current barrier which comprises a semiconductor material adjacent to said current spreading layer and/or to said electrical connector body.

17. An LED chip, comprising an epitaxial semiconductor layer sequence suitable for generating electromagnetic radiation, an electrical connector body, a radiation-transparent current spreading layer electrically conductively connected to said connector body and comprising a TCO, at least one current barrier suitable for selectively preventing, by means of a reduced current density, the generation of radiation in a region laterally covered by said connector body, wherein said current barrier is formed from semiconductor material of said epitaxial semiconductor layer sequence, from material of said current spreading layer and/or by an interface between said semiconductor layer sequence and said current spreading layer, and at least one current barrier which includes a portion of said TCO, said portion of said TCO being oxidized and/or being modified by means of introduced ions or atoms in such a way that its electrical conductivity is one-tenth the electrical conductivity of a remaining TCO of said current spreading layer.

18. An LED chip, comprising an epitaxial semiconductor layer sequence suitable for generating electromagnetic radiation, an electrical connector body, a radiation-transparent current spreading layer electrically conductively connected to said connector body and comprising a TCO, and at least one current barrier suitable for selectively preventing, by means of a reduced current density, the generation of radiation in a region laterally covered by said connector body, wherein said current barrier is formed from semiconductor material of said epitaxial semiconductor layer sequence, from material of said current spreading layer and/or by an interface between said semiconductor layer sequence and said current spreading layer, wherein said current spreading layer is adjacent to a semiconductor layer of said epitaxial semiconductor layer sequence and in that said interface comprises a first portion, in which an electrically conductive contact is formed between said current spreading layer and said semiconductor layer, and a second portion, in which no electrically conductive contact, or an electrically conductive contact whose conductivity is less than one-tenth the electrical conductivity of said contact in said first portion, is formed between said current spreading layer and said semiconductor layer.

19. An LED chip, comprising an epitaxial semiconductor layer sequence suitable for generating electromagnetic radiation, an electrical connector body, a radiation-transparent current spreading layer electrically conductively connected to said connector body and comprising a TCO, and at least one current barrier suitable for selectively preventing, by means of a reduced current density, the generation of radiation in a region laterally covered by said connector body, wherein said current barrier is formed from semiconductor material of said epitaxial semiconductor layer sequence, from material of said current spreading layer and/or by an interface between said semiconductor layer sequence and said current spreading layer, wherein a portion of said current spreading layer is disposed on a side of said connector body facing away from said semiconductor layer sequence.

20. An LED chip, comprising an epitaxial semiconductor layer sequence suitable for generating electromagnetic radiation, an electrical connector body, a radiation-transparent current spreading layer electrically conductively connected to said connector body and comprising a TCO, and at least one current barrier suitable for selectively preventing, by means of a reduced current density, the generation of radiation in a region laterally covered by said connector body, wherein said current barrier is formed from semiconductor material of said epitaxial semiconductor layer sequence, from material of said current spreading layer and/or by an interface between said semiconductor layer sequence and said current spreading layer, wherein a radiation-generating zone is disposed between two cladding layers, said epitaxial semiconductor layer sequence consisting, between one of said cladding layers and said current spreading layer, of an outer portion having a thickness less than or equal to 100 nm.

* * * * *

UNITED STATES PATENT AND TRADEMARK OFFICE
CERTIFICATE OF CORRECTION

PATENT NO. : 8,017,953 B2  
APPLICATION NO. : 12/158474  
DATED : September 13, 2011  
INVENTOR(S) : Berthold Hahn et al.

It is certified that error appears in the above-identified patent and that said Letters Patent is hereby corrected as shown below:

Title page, Item (54) and Column 1, lines 1-3, Title, delete "LUMINESCENCE DIODE CHIP WITH CURRENT SPREADING LAYER AND METHOD FOR PRODUCING THE SAME" and insert -- LED CHIP WITH CURRENT SPREADING LAYER AND METHOD FOR PRODUCING SAME --.

Title page (Inventors), column 1, line 4, delete "(SE);" and insert -- (DE); --.

Title page (Inventors), column 1, line 5, delete "Deonaustauf" and insert -- Donaustauf --.

Column 14, line 54, Claim 7, delete "claim 1" and insert -- claim 1, --.

Signed and Sealed this  
Thirtieth Day of October, 2012

David J. Kappos  
*Director of the United States Patent and Trademark Office*